United States Patent [19]

Smith et al.

[11] Patent Number: 5,594,886
[45] Date of Patent: Jan. 14, 1997

[54] PSEUDO-LRU CACHE MEMORY REPLACEMENT METHOD AND APPARATUS UTILIZING NODES

[75] Inventors: Michael B. Smith, Mississauga; Michael J. Tresidder, Scarborough, both of Canada

[73] Assignee: LSI Logic Corporation, Milpitas, Calif.

[21] Appl. No.: 443,887

[22] Filed: May 31, 1995

Related U.S. Application Data

[63] Continuation-in-part of Ser. No. 376,152, Jan. 20, 1995, abandoned, which is a continuation-in-part of Ser. No. 362,409, Dec. 23, 1994, and Ser. No. 363,237, Oct. 23, 1994.

[51] Int. Cl.[6] .......................... G06F 12/00; G06F 12/02; G06F 13/00
[52] U.S. Cl. .......................... 395/463; 395/445; 395/460; 395/481; 395/486; 395/48; 364/DIG. 1
[58] Field of Search ....................... 395/445, 444, 395/460, 461, 463, 466, 487; 364/DIG. 1

[56] References Cited

U.S. PATENT DOCUMENTS

| | | | |
|---|---|---|---|
| 5,185,861 | 2/1993 | Valencia | 395/471 |
| 5,218,687 | 6/1993 | Ducousso et al. | 395/455 |
| 5,261,053 | 11/1993 | Valencia | 395/460 |
| 5,295,253 | 3/1994 | Ducousso et al. | 395/417 |
| 5,325,504 | 6/1994 | Tipley et al. | 395/455 |
| 5,325,511 | 6/1994 | Collins et al. | 395/455 |
| 5,329,627 | 7/1994 | Nanda et al. | 395/417 |
| 5,353,425 | 10/1994 | Malamey et al. | 295/471 |

*Primary Examiner*—Tod R. Swann
*Assistant Examiner*—Tuan V. Thai
*Attorney, Agent, or Firm*—Riches, McKenzie & Herbert

[57] ABSTRACT

An apparatus and method implementing an algorithm for determining the most likely least recently used cache line in a cache so that this cache line can be written back to main memory. This algorithm is implemented on a bus control unit bridging a 50 Mhz multi-processor interconnect bus with a 33 Mhz peripheral component interconnect bus through an asynchronous interface. All data being transferred between the multi-processor interconnect bus and the peripheral component interconnect bus must pass through the input/output cache on the bus control unit. The algorithm determines a unique locating path to the last used cache lines and from this determines a unique locating path to a memory location which likely contains a least recently used cache line which can then be written back to main memory. Each memory location is identified by a unique locating path which passes through a nodal tree. Each node on the lowest level of nodes is associated with two memory locations, and, each pair of nodes is associated with one node on a next high level of nodes. Each node is associated with a bit in a register which is used to identify and record the unique path through the nodes of the cache lines being used and stored. The unique locating path to the memory location with the cache lines to be written back to memory, or otherwise evicted, is determined based on the stored value of bits.

19 Claims, 4 Drawing Sheets

PSEUDO-LRU CACHE MEMORY REPLACEMENT METHOD AND APPARATUS UTILIZING NODES

RELATED APPLICATIONS

This is a continuation-in-part application of commonly assigned U.S. application Ser. No. 08/376,152, filed on Jan. 20, 1995, entitled Bridge Cache Subsystem, now abandoned, which is a Continuation-In-Part application of U.S. application Ser. No. 08/362,409, filed on Dec. 23, 1994, entitled Memory Partitioning, now pending; and U.S. application Ser. No. 08/363,237, filed on Oct. 23, 1994, entitled Memory Interleaving, now pending and incorporated herein by reference.

BACKGROUND OF THE INVENTION

This invention relates to an improved cache controlling device and method, and in particular an improved cache controlling device and method to more efficiently determine the least used cache line for eviction from a cache when the cache is full. The invention also relates to an improved bus control device for bridging two data and address buses utilizing a cache controlled by the improved cache controlling device.

In the past, cache controllers have been used to store, organize and retrieve cache lines of data from the memory location of the cache. A particular problem which arises with all caches is selecting which cache line to write back to main memory or "evict" from the cache when the cache is full.

In the best case, the cache controller will send back to main memory a cache line which will not be required in the near future. Otherwise, inefficiencies will arise if the same cache lines are continuously written back and forth between the cache and main memory.

Several different algorithms and principles have been used to try to select which cache line will not be needed in the future and should be evicted from the cache. In general, the least recently used cache line should be evicted as this cache line will likely be the least recently used cache line in the future.

The least recently used cache line can be determined explicitly by tracking the use of the cache lines. However, this tends to be complicated and time consuming in practice. Also, it is only a general principle that the least recently used cache line in the past will continue to be the least recently used cache in the future. It is possible that the least recently used cache line may in fact be the cache line required next.

Therefore, there is an overall decrease in efficiency and an unnecessary increase in the cost of the system if too much effort is expended on determining the least recently used cache line. If a good approximation can be made of a cache line which is one of the least recently used cache lines, there are ever diminishing returns in trying to determine even better approximations or even the least recently used cache line.

Some cache controllers use a pseudo least recently used algorithm (pseudo-LRU) to determine the most likely least recently used cache line. Such a cache controller would determine the last used cache line and select the cache line next to the last used cache line as the likely least used cache line and evict that cache line. While this algorithm is attractive in its simplicity, it suffers from the fact that the cache line immediately next to the last used cache line is likely not the least used cache line because of the way data is stored in a cache. At best, this algorithm can only ensure the last used cache line is not evicted from the cache.

Accordingly, there is a need in the art for an improved pseudo-LRU algorithm which is simple and efficient to implement and which provides a fairly accurate indication of the least recently used cache line. Also, there is a need in the art for an improved pseudo-LRU algorithm which can be used in cases where the cache line sizes are programmable, and therefore the maximum number of cache lines possible in the cache varies. Also, there is a need for an improved pseudo-LRU algorithm which can be used in caches where some cache lines may be considered "locked", meaning that they can not be evicted, and yet a reasonable selection of a least recently used cache line can be made for eviction.

SUMMARY OF THE INVENTION

Accordingly, it is an object of this invention to at least partially overcome the disadvantages of the prior art. Also, it is an object of this invention to provide an alternative type of cache controller which utilizes an improved pseudo-LRU algorithm to efficiently and easily make a selection as to the least recently used, or one of the least recently used, cache lines in the cache for eviction.

Accordingly, in one of its aspects, this invention resides in providing a computer system having a first address bus and a first data bus, a cache device comprising: cache memory means comprising a maximum number of memory locations, each memory location operable to store one cache line of data; cache control means for controlling the storage of cache lines of data to the cache memory means from the first data bus and retrieval of cache lines of data from the cache memory means, said cache control means comprising a register means for storing binary values; wherein the maximum number of memory locations is equal to $2^N$ where N is an integer greater than zero; wherein the cache control means associates each memory location with a unique locating path, said locating path defined by one and only one node on each of N levels of nodes; wherein for a first level of nodes, the cache control means associates each pair of memory locations with a first level node, said first level nodes being associated with a binary value which identifies each memory location of the pair of memory locations associated with each of the first level nodes, each first level node being associated with one of the bits in the register means for storing the binary value of the first level node; wherein for each level of nodes to a (N-1)th level, the cache control means associates each pair of nodes on a level of nodes with a higher level node, each of said higher level nodes being associated with a binary value which identifies each node of the pair of nodes associated with each of the higher level nodes, each higher level node being associated with one of the bits in the register means for storing the binary value of the higher level node; wherein after the cache control means retrieves a cache line of data from one of the memory locations, the cache control means sets the bits in the register means to identify the unique locating path of the memory location from which the cache line of data was retrieved; and wherein when all of the memory locations have cache lines stored therein, the cache control means evicts a cache line of data stored in a memory location identified by a unique locating path passing through one node on each of the N levels of nodes such that the binary value associated with each node is opposite to the value of the bit in the register means corresponding to each level.

In a still further aspect, the present invention relates to a computer system having a first address bus and a first data bus, and a second address bus and second data bus operating independently of the first address bus and the first data bus, a bridge means for bridging the first address bus and the first data bus with the second address bus and the second data bus, said bridge means comprises: error detection means to detect errors on the first data bus, the first address bus, the second address bus and the second data bus; control means for systematically injecting errors into the bridge means to test the error detection means; and wherein the errors systematically injected by the control means comprise parity errors on the first data bus, the second data bus, the first address bus and the second address bus, target abort cycles and retry configuration cycles.

Further aspects of the invention will become apparent upon reading the following detailed description and the drawings which illustrate the invention and preferred embodiments of the invention.

BRIEF DESCRIPTION OF THE DRAWINGS

In the drawings, which illustrate embodiments of the invention.

DETAILED DESCRIPTION OF PREFERRED EMBODIMENTS OF THE INVENTION

Figure 1:
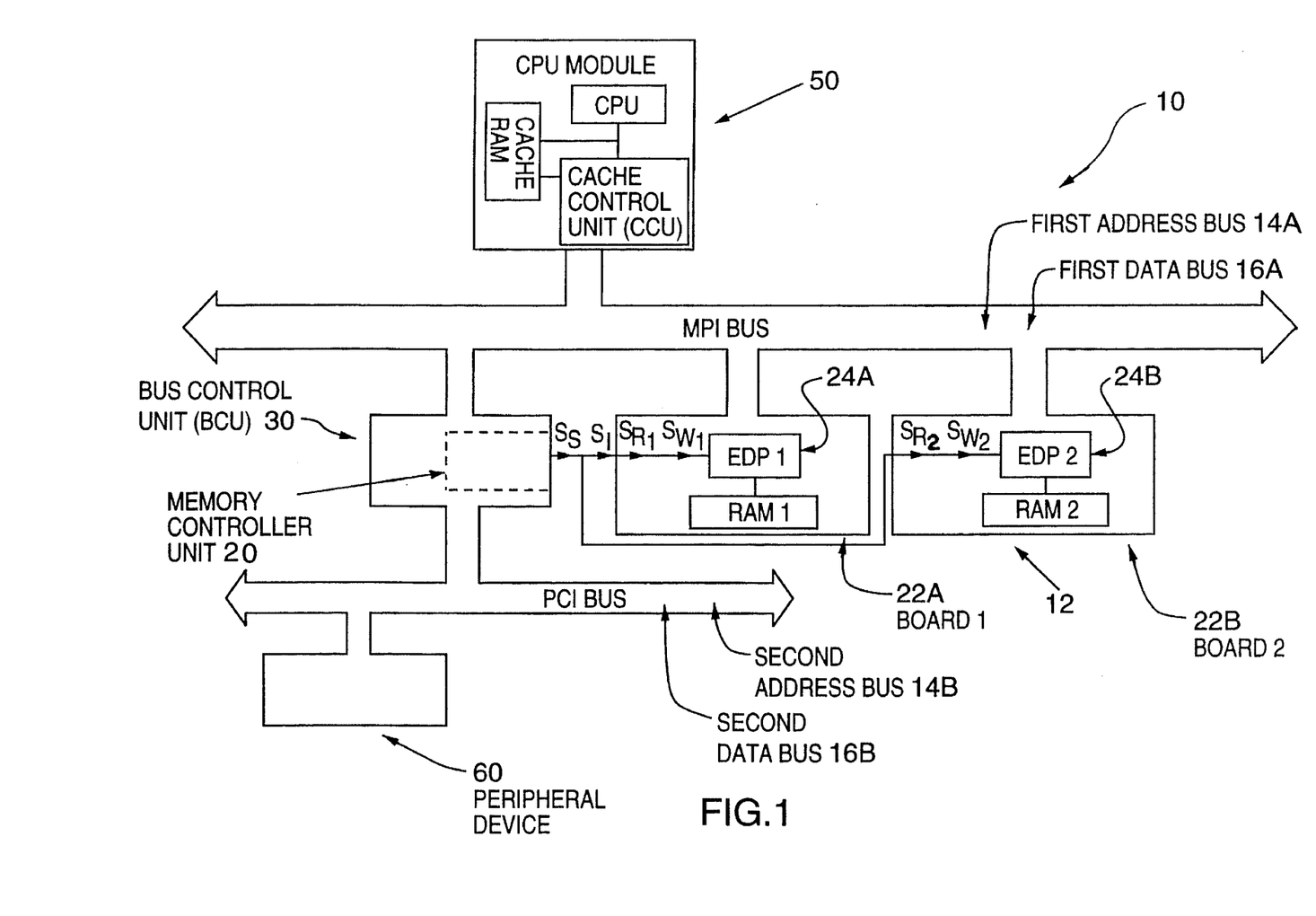
FIG. 1 is shows a schematic representation of a computer system incorporating a bus control unit which utilizes a cache controller according to one embodiment of the present invention.

FIG. 1 shows a computer system, shown generally by reference numeral 10, having a memory system, shown generally as 12. The memory system 12 comprises several actual memory banks, two of which are shown in FIG. 1 as RAM1 and RAM2. The memory devices RAM1 and RAM2 comprise several memory locations to store and retrieve groups of data, as is known in the art. In general, the groups of data can be bytes, words, or other combinations of bits.

Each memory bank RAM1 and RAM2 comprises one or more self-contained chips having independent connections to the first address bus 14A and the first data bus 16A. The chips are generally dynamic random access memory chips of different sizes, such as 256KBs, 1MB, 4MB or 16MB.

Computer system 10 comprises a central processing unit ("CPU") shown on a CPU module 50. The CPU module 50 also comprises a cache RAM and a cache control unit CCU for interfacing with the first address bus 14A and the first data bus 16A. In a preferred system 10, up to four additional CPU modules 50 can be included in the system 10, each CPU module 50 running symmetrically.

In a preferred embodiment, as shown in FIG. 1, the first address bus 14A and the first data bus 16A are temporally multiplexed and comprise the same lines. In this way, when data is stored or retrieved, the address is sent first and then the data is read from or written into the memory system 12 or a peripheral device 60 on at least some of the same lines upon which the address was sent. In a preferred embodiment, the data bus 16A comprises 64 lines and the address bus 14A comprises 32 lines, which are also the first 32 lines of the data bus 16.

As is also shown in FIG. 1, the system 10 comprises a bus control unit ("BCU") 30 for controlling the first address bus 14A and the first data bus 16A as well as controlling and providing a bridge to the peripheral component bus ("PCI bus") which comprises the second address bus 14B and second data bus 16B. In addition, the bus control unit 30 comprises a memory controller unit 20 which sends control signals $S_R$ and $S_W$ to the memory banks RAM1 and RAM2 to control the read and write operations to and from memory locations within memory banks RAM1 and RAM2. In this embodiment, the first address bus 14A and second address bus 14B are collectively referred to as the multi processor interconnect bus ("MPI bus") referring to the fact that this MPI bus can support more than one CPU.

The memory controller unit 20 provides write control signals $S_W$ and read control signals $S_R$ to control the storing and retrieval of data in the memory system 12, including memory units RAM1 and RAM2. Memory controller unit 20 sends a write control signal $S_W$ to a memory unit, RAM1 or RAM2, to cause the memory unit, RAM1 or RAM2, to store the data presented on the first data bus 16A. Likewise, memory controller unit 20 sends a read control signal $S_R$ to the memory units, RAM1 or RAM2, to retrieve data stored in the memory units, RAM1 or RAM2.

It is understood that while the present discussion relates to only two memory units, RAM1 and RAM2, several such memory units may be incorporated in the memory system 12 and each would be controlled by the memory controller unit 20 in a similar manner to that described above with respect memory banks RAM1 and RAM2.

The buffers 24A and 24B in a preferred embodiment are data pipeline chips ("EDP chip"). The EDP chip comprises error correction circuitry ("ECC") as well as write buffers and prefetch buffers to assist in interfacing with the first data bus 16A.

The buffers 24A and 24B are located between the first and second memory units RAM1 and RAM2 and the first data bus 16A. It is apparent that one buffer 24A or 24B is required for each memory board 22A or 22B. In the preferred embodiment, the EDP chip accommodates only 64 bits of data, and therefore each buffer 24A and 24B comprises two EDP chips to accommodate the entire 128 bits of data on the memory data bus, but other arrangements are possible.

In the embodiment shown in FIG. 1, the memory units RAM1 and RAM2 are shown on separate boards, namely boards 22A and 22B, respectively. In this embodiment, the memory controller unit 20 comprises separate lines to select each of the boards 22A and 22B separately, and can also simultaneously select both boards 22A and 22B.

In a preferred embodiment, the computer system 10 comprises slots for insertion of up to four memory boards (not shown). The memory controller 20 has 2 lines called SLOTSEL[1:0] which are connected to the EDP chips and select a target slot of the four possible slots. In one mode of operation, the memory controller unit 20 supports interleaving between two separate boards 22A and 22B, in which case two boards are selected by the memory controller unit 20. In another mode of operation, the memory controller unit 20 supports interleaving between memory units on the board 22, in which case only the board having the memory units RAM1 and RAM2 would be selected.

The memory controller means 20, in one preferred embodiment, sends other interfacing control signals $S_I$ to the buffer means 24A and 24B. These interfacing control signals $S_I$ include the select signals $S_S$ which select the buffer means 24A and 24B. The interfacing control signals $S_I$ also configure the buffer means 24A and 24B for different modes of operation such as interleaving or non-interleaving, error correction or non-error correction, and other modes of operation. In addition, the bus controller unit 30 sends interrupt control signals to other electronic components connected to the MPI-bus to signify different errors having occurred.

Figure 2:
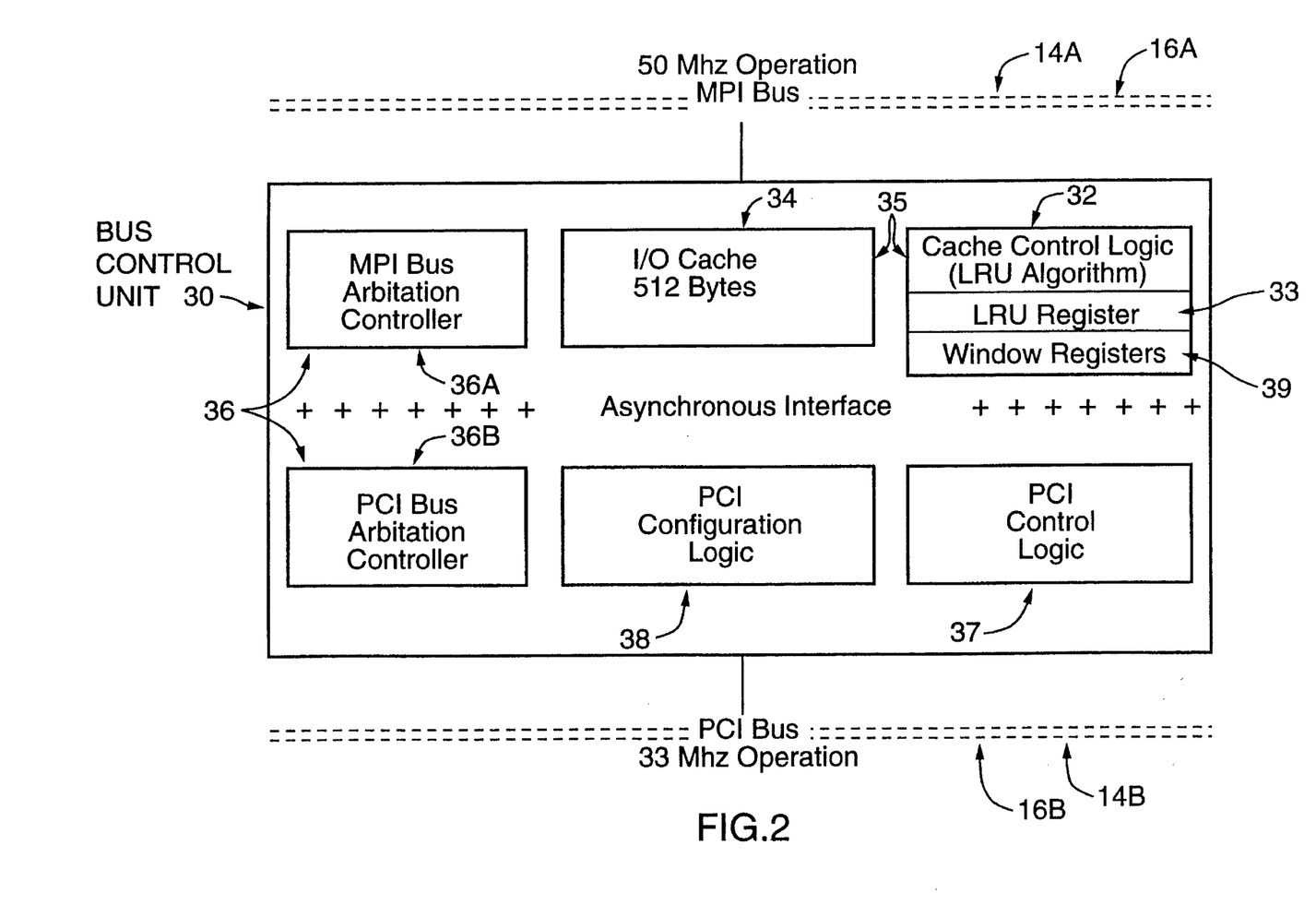
FIG. 2 is a schematic representation of a bus control unit according to one embodiment of the present invention.

FIG. 2 shows the bus control unit 30 in more detail. As can be seen from FIG. 2, the bus control unit 30 comprises an input/output cache ("I/O cache") 34 of a fixed maximum capacity meaning that the I/O cache 34 can be a maximum number of bytes of data. In this case, the I/O cache 34 can store 512 bytes of data.

The I/O cache 34 can be segregated to hold cache lines of different length. For example each cache line could be 4×64 bits per line, 8×64 bits per line, 16×64 bits per line or 32×64 bits per line. It is apparent that as the I/O cache is of a fixed capacity, namely 512 bytes, the greater the size of the cache line, the fewer cache lines which may be held. Accordingly, for cache lines composed of 4×64 bits per line, 16 cache lines may be held. However, only 8 cache lines of 8×64 bits per line may be stored, and, for cache lines composed of 16×64 bits per line, only 4 cache lines may be stored. Likewise, for cache lines composed of 32×64 bits per line, the I/O cache 34 may hold only 2 cache lines.

Accordingly, the I/O cache can store a maximum number of cache lines in a maximum number of memory locations. It is preferable that the maximum number of memory locations, and therefore the maximum number of cache lines storable in the I/O cache 34, is a power of 2. In other words, the maximum number of memory locations is equal to $2^N$ where N is an integer greater than 0. The integer N also has another function described in more detail below.

Also, for the purposes of this discussion, the memory locations in the I/O cache 34 shall be considered to be the size of one cache line of data regardless of the size of the cache line. It is understood that the memory locations are arbitrarily set to be the size of one cache line of data and may be composed of several individual memory locations addressable in different sizes. Also, as the I/O cache 34 has programmable cache sizes the size of the memory location of the cache device 35 will be considered to be changeable. As a practical matter however, by increasing the size of the cache line, the bits of storage in the I/O cache 34 will simply be arranged in different sized groups of 64 bits.

It is apparent that different size cache lines and different size input/output cache may be selected. In the present circumstances, it is preferable that the cache lines be multiples of 64 bits as that is the size of the first data bus 16A on the MPI bus. In practice, the size of the cache lines for the I/O cache 34 will be the same as the cache lines used by the cache control unit CCU on the CPU module. It is apparent that it is advantageous for these to be the same size to improve communication between these two units.

The I/O cache 34 is controlled by the cache control logic 32. The cache control logic 32 comprises the pseudo least recently used ("pseudo-LRU") algorithm discussed in more detail below and with reference to FIGS. 3A and 3B.

It is understood that the cache device 35 and the cache control logic 32 could control a cache used in association with any other electronic component in the system 10. In other words, the pseudo-LRU algorithm and cache control logic 32 described herein need not be used in association with an I/O cache 34 bridging the MPI bus and the PCI bus only. This is merely a preferred embodiment of the present invention and the cache device 35 could be utilized in association with other chips other than with the bus control unit 30.

In addition to implementing the pseudo-LRU algorithm, the cache control logic 32 also controls the storage of cache lines of data to the cache device 35 from the first data bus 16A, shown as the MPI bus in FIGS. 1 and 2, and the retrieval of information from the I/O cache 34 and placement of the data on the first data bus 16A. Likewise, the cache control logic 32 controls the storage of cache lines of data to the I/O cache 34 from the second data bus 16B, shown as the PCI bus in FIGS. 1 and 2, and the retrieval of cache lines of data from the I/O cache 34 and placement of that data on to the second data bus 16B. It is apparent that cache lines of data stored by the cache control logic 32 from the second data bus 16B may be retrieved by the cache control logic 32 and then placed on the first data bus 16A, and vice versa. In this way, data may be transferred from the 50 Mhz MPI bus to the 33 Mhz PCI bus through an asynchronous interface as shown in FIG. 2. A specific operation of the asynchronous interface is discussed in more detail below.

In a preferred embodiment, the cache control logic 32 utilizes an LRU register 33 to implement the pseudo-LRU algorithm. The LRU register 33 stores the LRU bits, the function of which is described in more detail below and in Appendix A.

Figure 3A:
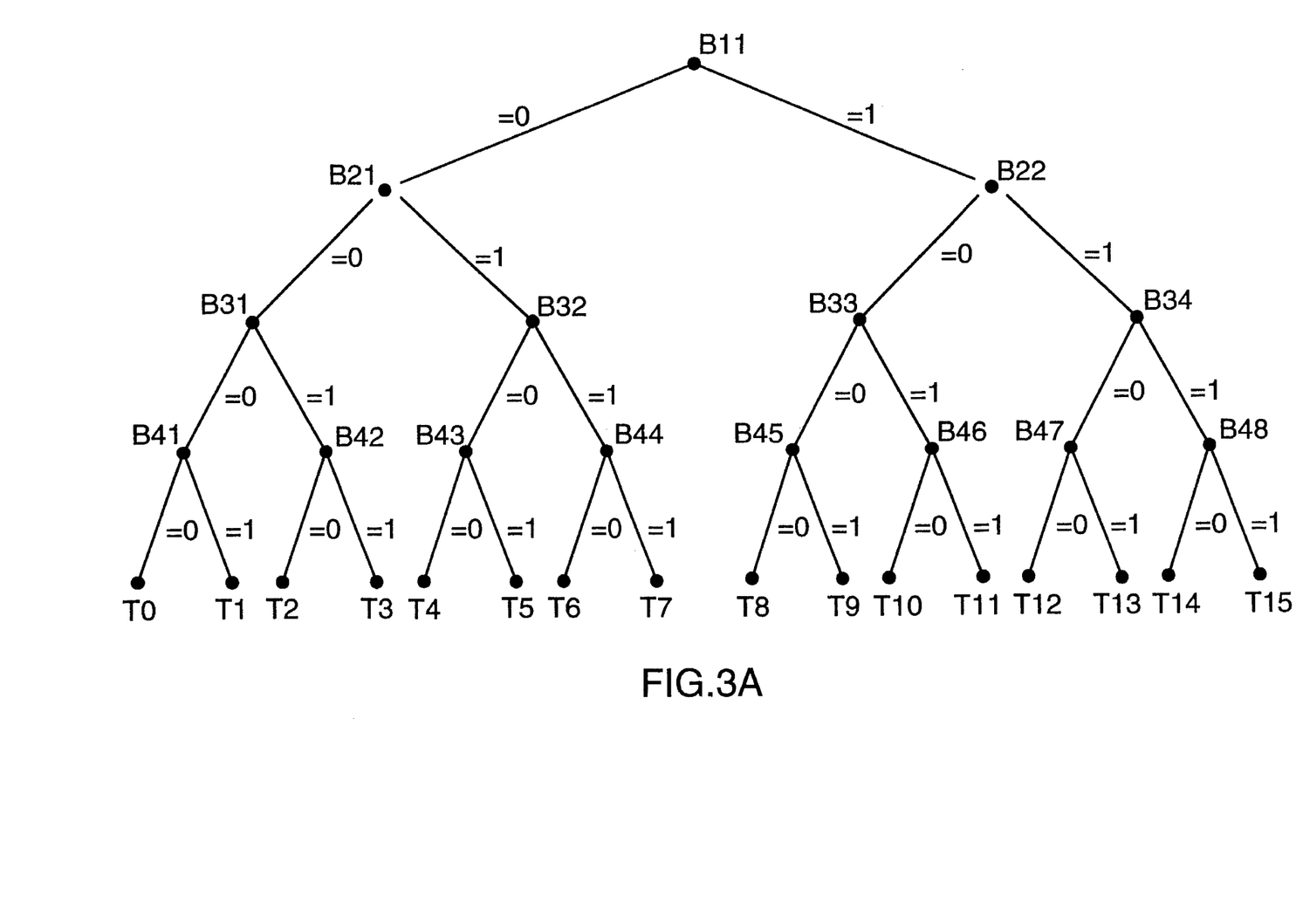
FIG. 3A is a symbolic representation of a pseudo-LRU algorithm utilized by a cache controller with a maximum number 16 memory location for storing 16 separate cache lines according to one embodiment of the present invention.

Referring to FIG. 3A, this figure shows the method of storage of the cache lines of data in the I/O cache 34. In FIG. 3A, the memory locations for storing the cache lines of data are represented by the tags shown with a capital T followed by an integer from 0 to 15. It is apparent that in FIG. 3A, there are 16 memory locations shown by the tags T0 to T15. In this embodiment, the maximum number of memory locations in which cache lines may be stored is 16, and, therefore the integer N is equal to 4.

Figure 3B:
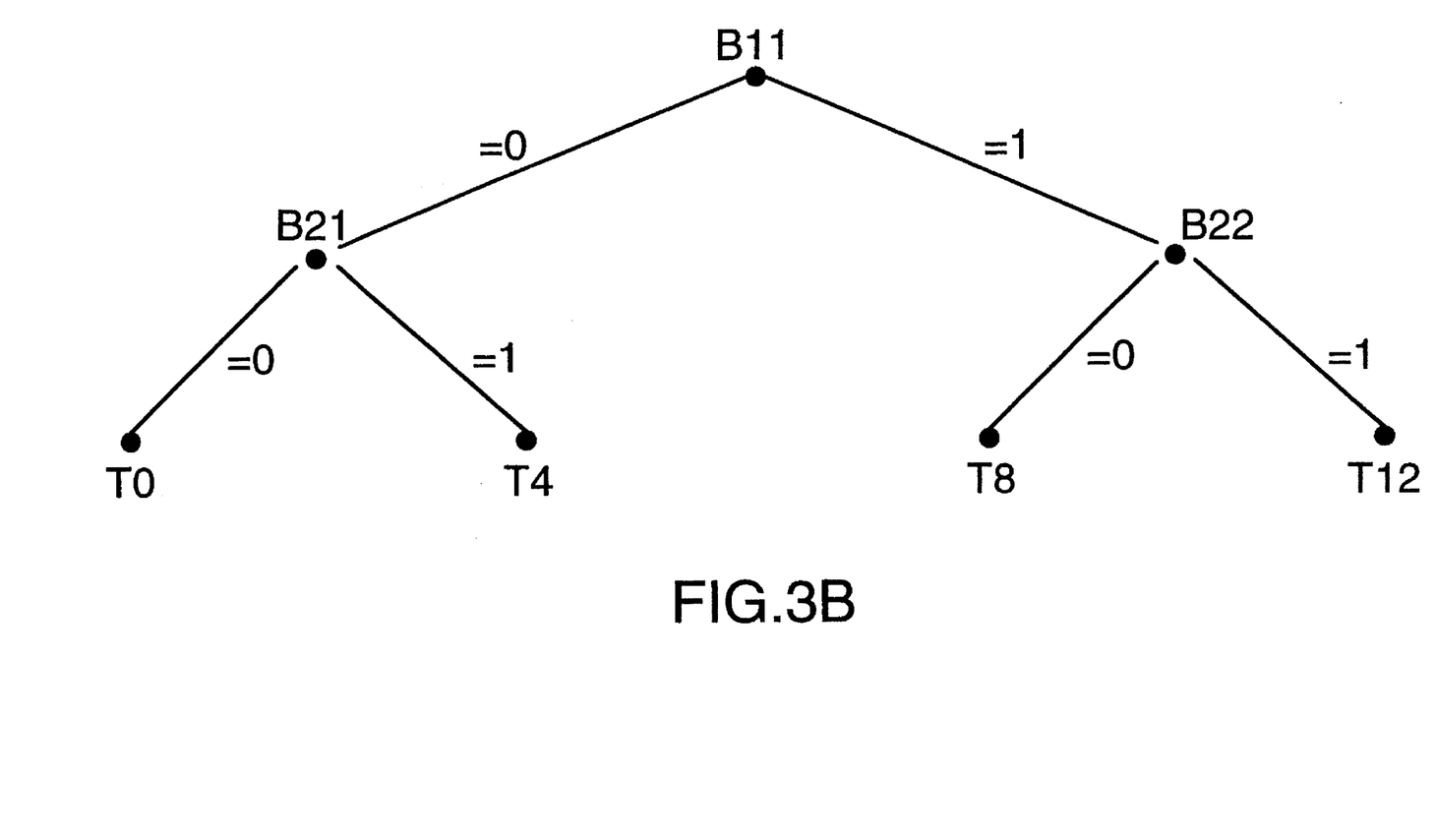
FIG. 3B is a symbolic representation of a pseudo-LRU algorithm utilized by a cache controller with a maximum number 4 memory location for storing 4 separate cache lines according to one embodiment of the present invention.

The cache control logic 32 organizes the cache lines of data within the I/O cache 34 by associating each memory location for storing a cache line of data with a unique path. This unique path passes through a series of nodes shown as Bxy, where x and y are integers and x represents the level of the node. Because the maximum number of memory locations is 16, the integer N is equal to 4 and therefore there are 4 levels of nodes shown as B1y through to B4y. It is apparent that the number of levels is dependent on the maximum number of memory locations of the I/O cache 34 within which cache lines may be stored. There could be fewer levels as shown in FIG. 3B. In any event, the first level of nodes is considered to be the level of nodes closest to the memory location represented by tags T0 to T15 for storing the cache lines. In FIG. 3A, the first level of nodes is represented by B4y and there are eight of them.

A pair of memory locations is associated with each first level node B4y. For example, the first level node B43 is associated with memory location tags T4 and T5. To identify or differentiate between memory locations T4 or T5, the cache control logic 32 associates a bit in the LRU register 33, referred to as an LRU bit, with node B43. The value of the bit associated with node B43 identifies memory location T4 or T5 by having a value of 0 or 1, respectively, as shown in FIG. 3A. Therefore, a value of 0 for the LRU bit associated with node B43 will identify the memory location T4, and therefore the cache line of data contained therein, and a value of 1 for the LRU bit associated with node B43 will identify memory location T5 and the cache line of data contained therein.

As with the first level nodes B4y, there are higher level nodes B3y, B2y and B1y. For each level of nodes from the first level B4y to the (N-1)th level (in FIG. 3A the (N-1)th level is shown by nodes as B2y) there will be an even number of nodes for each level. For each of these levels, the nodes are grouped in pairs, as the memory location T0 to T15 were grouped in pairs, and associated with a higher level node. For example, node B43 is grouped with node B44 to form a pair and this pair is associated with the higher level node, B32. The cache control logic 32 associates the LRU bit in the LRU register 33 with node B32. The value of the LRU bit corresponding to node B32 identifies one of the nodes B43 or B44 of the pair of nodes B43 and B44. For example, as shown in FIG. 3A, node B43 is identified by a 0 value being associated with node B32 and node B44 is identified by a 1 value. Likewise, each of the nodes B3y on the third level are associated with an LRU bit which can identify each of the pairs of nodes with which it is associated.

Likewise, the nodes on the third level B3y are grouped in pairs and each pair is associated with a higher level node, in this case a node on the second level B2y. Each node on the second level B2y is associated with an LRU bit in the LRU register such that the value of this bit identifies one of the pairs of nodes.

This association continues to the Nth level, here shown by node B11, which is the highest level and has a single node B11. Node B11 is also associated with an LRU bit in the LRU register 33. In all cases, regardless of the value of the integer N, there will only be one node on the highest level and this node could be considered a root node.

In the case where N is set to 1, meaning there are only two memory locations for storing cache lines in the I/O cache 34, each memory location capable of storing a cache line composed of 32×64 bits per line, node B11 would be both the first level and the highest level node. In this case, there would not be any higher level nodes.

Accordingly, each memory location tag T0 to T15 has a unique path starting at the highest or Nth level of nodes and passing through only one node on each of the N levels of nodes. The unique path identifying each memory location is determined by the LRU bits stored in the LRU register 33. For example, for the cache line of data in memory location tag T4, the values of the LRU bits corresponding to a node on each of the levels would be B11 equals 0, B21 equals 1, B32 equals 0 and B43 equals 0.

In a preferred embodiment, the LRU register 33 has one unique bit associated with every possible node that may exist. The value of the LRU bits in the LRU register 33 associated with the nodes through which the unique path to memory location tag T4 does not pass are not relevant for memory location tag T4.

Each time there is a hit in the I/O cache 34, the cache control logic 32 sets the bits in the LRU register 33 to identify the unique path of the memory location from which the cache line of data was retrieved. For example, if the cache line of data was retrieved from memory location tag T4, the values of the nodes B11, B21, B32 and B43, as indicated above, would be stored in the LRU register 33.

It is apparent that the cache control logic 32 could also set the bits when a cache line of data is stored in a memory location tag T0 to T15, as well as when a cache line of data is retrieved. If the bits are set when data is stored, there will also be a difference during initial use of the cache 32, before the cache 32 becomes full. During initial use, for example at start-up, the memory locations Tag 0 to T15 would be empty, and therefore cache lines of data would be stored without any evictions. In this case, the bits in the LRU register 33 may be set to different values, whether the bits are being set during storage and/or retrieval of data, if there is a hit in the cache 32 before the cache is full. In a practical application, there will be no hits before the cache 32 is full because at start-up a large amount of data is transferred through the cache 32, from the PCI-bus to the MPI-bus, such that the cache 32 fills quickly. Once the cache 32 is filled, it will remain filled unless cache lines are evicted.

When the I/O cache 34 is full, it is apparent that a cache line of data would need to be retrieved from one of the memory locations tags T0 to T15 and written back to main memory RAM1 or RAM2 in the memory subsystem 12 before another cache line of data can be placed in the I/O cache 32. For the purposes of the specification, the process of retrieving data stored in one of the memory locations tags T0 to T15 and writing it back to main memory RAM1 or RAM2, shall be referred to as an "eviction".

In a preferred embodiment, where the system 10 uses a MESI-protocol to maintain data coherency, not all of the data stored in the cache 34 will be sent back to main memory 12. Only cache lines of data which are in a Modified state must be stored back in main memory 12 to maintain data coherency. Cache lines of data which are in an un-Modified state, namely those in an Exclusive, Shared or Invalid state, can be "discarded" for example by storing new data in the memory location containing the un-Modified data thereby overwriting the un-Modified cache line. In a further preferred embodiment, all un-Modified cache lines, namely cache lines in an Exclusive, Shared, or Invalid state are evicted first. This increases the efficiency of the data transfer between the MPI-bus and the PCI-bus because un-Modified cache lines need not be written back to main memory.

In order to select a cache line to be evicted from the I/O cache 34, the cache control logic 32 utilizes the pseudo-LRU algorithm as follows. The cache control logic 32 will evict the cache line of data in the memory location tags T0 to T15 identified by a unique path which has LRU bits with an opposite value to the value of the current LRU bits. In other words, the cache control logic 32 selects a cache line of data to evict which has an opposite unique path to the unique path of the memory location from which information has been previously retrieved. As the LRU bits identifying the unique path for the memory location from which the last cache line of data was retrieved are stored in the LRU register 33, the cache control logic 32 can flip the values of the bits in the LRU register 33 to obtain the value of the bit for each node on each level to identify the unique path for the memory location of the cache line of data which is to be evicted. It is important to note that because the value associated with the nodes for each level would be different, the nodes identifying the unique path will be different except for the highest level node or root node B11 through which all of the unique paths pass.

For example, if the last cache line of data was retrieved from memory location tag T4, the LRU register 33 will be set with the values for the LRU bits designating memory location tag T4. If the I/O cache 34 is full such that there are cache lines of data stored in all of the memory locations, one cache line of data must be evicted to make room for another cache line of data. The cache control logic 32 will evict the cache line in the memory location having a unique path defined by nodes with values which are opposite to the value of the bits in the LRU register 33. Therefore, for the highest level, the value of the bit will be 1, which is opposite to the value 0 which was the value for the LRU bit for node B11 for the unique path identifying memory location tag T4.

As the opposite value for the bit corresponding to node B11 is the value 1, the next node in the unique path for the cache line to be evicted is B22. It is apparent that the unique path for memory location tag T4 did not pass through node B22. Nevertheless, node B22 will be used to identify the memory location of the cache line to be evicted. Therefore, the value associated with node B22 for identifying the unique path for the memory location to be evicted will be an opposite value of the bit associated with node B22. Therefore, the bit value for node B22 shall be the value previously set by the cache control logic 32 depending on which of the memory locations T8 to T11, or, T12 to T15 cache lines of data were previously stored to or retrieved from. In a similar manner, a third level node and a fourth level node will be identified and finally a memory location will be identified.

Accordingly, when a cache line in a memory location must be evicted, the cache control logic 32 will evict a cache line in a memory location having a unique path passing through one node on each of the N levels of nodes such that the binary value associated with each node is opposite to the value of the bits in the LRU register 33 corresponding to the appropriate node on each level. These values are stored in the LRU register 33 and are easily accessible.

This pseudo-LRU algorithm has several advantages. Firstly, because of the manner in which cache lines in the cache tend to be stored, it is likely that cache lines near the last used cache line may be retrieved next. Therefore, evicting the cache line next to the last retrieved cache line would likely not be efficient. Furthermore, the pseudo-LRU algorithm described above is easily adaptable if the cache line size increases and there is a corresponding decrease in the maximum number of cache lines in the I/O cache 34.

For example, referring to FIG. 3B, this figure shows only 4 memory locations, tags T0, T4, T8 and T12 for storing cache lines of data. In this case, if we presume the same I/O cache 34 having a maximum capacity of 512 bytes is used, each cache line would have a size of 16×64 bits per line. Accordingly, there has been a decrease in the maximum number of cache lines by a factor of 4 from 16 to 4, but there has been a corresponding increase by a factor 4 in the size of each cache line from 4×64 bits per line to 16×64 bits per line. It is also apparent that changing the grouping of the bytes in the I/O cache 34, represented by changing the integer N, does not affect the maximum number of bytes of I/O cache 34, which remains as 512 bytes.

Referring to FIG. 3B, if the last used cache line was T0, then the values for the bits associated with nodes B11 and B21 stored in the LRU register 33 would be 0 and 0, respectively. Accordingly, if a cache line was located in each of the memory locations such that a cache line must be evicted, the cache control logic 32 would evict the cache line in one of memory locations tag 8 or tag T12 because the unique path identifying memory locations tag 8 and tag T12 passes through node B11 and is identified by node B11 having a value of 1, which is an opposite value to the value of the node B11 identifying memory location tag T0. As for which of memory locations tag 8 or tag 12 are evicted, that will depend on the value of the bit in the LRU register associated with node B22. The value of node B22 will be set according to whether a cache line of data was last retrieved or stored to memory location T8 (B22=0) or memory location T12 (B22=1). In either case, this algorithm will evict the memory location tags T8 or T12 which is identified by a unique path passing through node B22 but with an opposite value to the value of node B22 stored in the LRU register. As between memory locations Tag 8 and Tag 12 this algorithm will also evict the cache line of data which was there the longest. In fact, in this example, the algorithm will always evict the cache line of data that was there the longest, unless that was memory location tag 0.

It is apparent the pseudo LRU algorithm described above has recorded, by means of the nodes and the bits in the LRU register 33, the last or most recently used cache line of data and then, when determining which cache line of data should be evicted, has selected the cache line of data stored in the memory location having a unique path identified by values opposite to the values stored in the LRU register 33. However, it is apparent that an identical result could be obtained by storing values in the bits of the LRU register 33 which do not identify the unique path of the memory locations from which the cache lines have been retrieved or stored, and then, when the cache 34 is full, evicting the cache line of data in the memory location identified by the values of the bits stored in the LRU register 33.

For example, referring again to FIG. 3B, an embodiment of the invention will be described where the bits associated with each of the nodes do not store the value associated with the unique path of the memory location being stored or retrieved, but rather store the opposite of the value of the unique path of the memory location being stored or retrieved. In this case, it may be said that the bits associated with the nodes represent the least recently used cache line of data, rather than the most recently used cache line of data which was the embodiment described above.

In this embodiment, if a cache line of data was stored or retrieved in one of memory location Tag 0 or Tag 4 then the value of bit B11 would be set to 1, which is the value which does not identify memory location Tag 0 or Tag 8. Likewise, the value for node B21 will be set to 1 if memory location Tag 0 is accessed, and will be set to 0 if memory location Tag 4 is accessed, both of which represent the opposite of the value for that node of the unique path identifying the memory location being retrieved or stored. In either of these cases, the value for bit B22 would not be updated, but would retain the value set by the last access of either memory location Tag 8 or Tag 12.

Selection of the cache line to be evicted in this case can be accomplished simply by using the values stored in the LRU register 33 and these values need not be flipped to give an opposite, as was done above, but rather their present values identify the proper memory location which must be evicted. For example, with reference to FIG. 3B, the following table shows the values of the nodes B11, B21 and B22 and corresponding memory locations identified or selected for eviction:

TABLE 1

| B11 | B21 | B22 | Selected Cache Line |
|---|---|---|---|
| 0 | 0 | X | Tag 0 (Line 0) |
| 0 | 1 | X | Tag 4 (Line 1) |
| 1 | X | 0 | Tag 8 (Line 2) |
| 1 | X | 1 | Tag 12 (Line 3) |

The letter X in the above table indicates that the unique path identifying the memory location for eviction does not pass through the node and the value of the node is not relevant. However, it is understood that the node will retain the value previously stored therein.

It is apparent that the two embodiments described above, namely storing the most recently used cache lines and evicting the cache line in the memory location identified by a unique path having opposite values, or, storing the least recently used cache lines by storing the opposite value of the cache lines being retrieved and evicting the cache line in the memory location identified by a unique path having the values stored, produce an identical result. Also, in both embodiments, the size of the memory locations can be altered by changing the value of the integer N thereby changing the size of the nodal tree.

In general, a cache control means will not evict a cache line until it is apparent that information required by the element or system associated with the cache requires information or data which is not in the cache control logic 32. In this case, a request for data would be made, a search would be conducted and, if the cache is full, only then would a cache line be evicted. However, in a preferred embodiment of the present invention, the cache control means detects when Modified cache lines of data are stored in all the memory locations, indicating that the I/O cache 34 is full, and evicts a cache line in a memory location immediately, before a subsequent request for a cache line occurs. In other words, upon the cache control logic 32 detecting that there are Modified cache lines of data stored in all of the memory locations, regardless of the configuration of the I/O cache 34, one line in the cache is automatically written back to the main memory RAM1 or RAM2 before a request for a new cache line of data is made. In this way, subsequent requests for data which are not present in the I/O cache 34 can be fulfilled without having to perform an eviction cycle. This feature improves the efficiency of the I/O cache 34, and in an embodiment where the cache device 35 is implemented in a bus control unit 30, I/O latency to memory is reduced, especially in heavily loaded systems.

One disadvantage of this is that a cache line of data is evicted from the I/O cache 34 before the next request for data, so the cache line evicted could be the cache line of data which is requested. By evicting a cache line of data before a subsequent request, there is a possibility that the cache line evicted is the same one which will be requested next. However, this is an unlikely occurrence and it is much more likely that room will be made for a different cache line of data.

In a further preferred embodiment, prior to the cache control logic 32 implementing a pseudo-LRU algorithm to evict a cache line of data, the cache control logic 32 will conduct a search in the I/O cache 34 to see if there are any invalid cache lines. If any invalid cache lines are detected, the memory location containing the invalid cache line would be cleared and no pseudo-LRU algorithm will need to be run.

This increases overall efficiency in two ways. First, a cache line of data which is in an Invalid state cannot be used by the system 10 because the data is not upto date and therefore there is no reason to keep the data in the cache 34. Second, a cache line of data in an invalid state need not, and should not, be written back to main memory 12, but rather can be simply overwritten with new data. This results in a time saving when evicting or replacing a cache line of data which is invalid because the memory controller unit 20 does not have to write the cache line of data back to main memory 12.

In a preferred embodiment as shown in FIG. 2, the cache device 35 is implemented in the bus control unit 30 and bridges the MPI bus with the PCI bus. In this embodiment, the cache control logic 32 stores cache lines of data in the I/O cache 34 from the first data bus 16A or the second data bus 16B. The cache lines of data can then be retrieved by the cache control logic 32 and placed on the first data bus 16A or the second data bus 16B regardless of which data bus the cache line of data originally came from. In this way, the bus control unit 30 acts as a bridging means to bridge the first data bus 16A and the second data bus 16B so that information can cross from the 50 Mhz MPI bus to the 33 Mhz PCI bus across an asynchronous interface.

In another preferred embodiment, the MPI bus is the first data bus 16A and is 64 bits wide while the standard PCI bus is the second data bus 16B and is only 32 bits wide. In addition to the asynchronous interface between the 50 Mhz MPI bus and the 33 Mhz PCI bus, the cache device 35 also overcomes the problem of the first data bus 16A having a different size than the second data bus 16B.

It is preferred that the LRU algorithm of the present invention be based on the PCI-bus accesses to the I/O cache 34 and not the MPI-bus accesses. This means that only accesses from the PCI-bus, namely storage or retrieval of data, will change the state of the LRU bits in the LRU register 33 and that accesses from the MPI-bus to the I/O cache 34 will not change the state of the LRU bits in the LRU register 33. This arrangement is preferable because the PCI-bus is slower than the MPI bus and the PCI-bus initiates more accesses to the I/O cache 34 than the MPI-bus, Therefore, basing the LRU algorithm on the PCI-bus will increase overall efficiency more than basing the LRU algorithm on the MPI-bus.

In a preferred embodiment, all data passing from the first data bus 16A to the second data bus 16B must first pass through the cache device 35. This means that all data passing from the first data bus 16A to the second data bus 16B must first be stored in one of the memory locations of the I/O cache 34. Likewise, all data passing from the second data bus 16B, namely the PCI bus, to the first data bus 16A, namely the MPI bus, must first be stored in one of the memory locations in the I/O cache 34.

It is apparent that there may be a simultaneous request for the same cache line of data from both the MPI bus and the PCI bus. In the event that this occurs, the bus control unit 30 comprises an arbitration controller 36 which comprises an MPI bus arbitration controller 36A and a PCI bus arbitration controller 36B. The MPI bus arbitration controller 36A and the PCI bus arbitration controller 36B control access to each cache line of data in the I/O cache 34 so that a simultaneous request to the same cache line would be arbitrated and granted to one of the PCI bus or the MPI bus.

In a preferred embodiment, the I/O cache 34 comprises a 512 byte cache implemented with a triple ported RAM. This RAM has two read ports and one write port so that two operations can occur asynchronously and simultaneously during the bridge operation provided that the two operations do not involve the same cache line of data. The cache control logic 32 and the arbitration controller 36 permit asynchronous and simultaneous operation of the bridge and ensure that the same cache line is not written to and read from the PCI bus and the MPI bus simultaneously.

In another embodiment, the bus control unit 30 comprises PCI configuration logic 38. The PCI configuration logic 38 contains the relevant data on each of the peripheral devices 60 connected to the PCI bus so that proper protocol and interfacing may be performed between the bus control unit 30 and each of the peripheral devices 60 connected to the PCI bus. The PCI control logic 37 utilizes the PCI configuration logic 38 and, in response to control signals from the CPU module 50, control the peripheral devices 60 connected to the PCI bus.

In order to increase the versatility of the system 10 it is preferred that the cache control logic 32 can be programmed to "lock" a memory location so that a cache line of data stored in the locked memory location cannot be written back to main memory RAM1 or RAM2 until the cache control logic 32 changes the status of the memory location from locked to unlocked. In other words, a memory location which has been designated to be locked by the cache control logic 32 is not evictable in that the cache control logic will not write back the cache line of data in a locked memory location to make room for a new cache line of data.

In the event that the I/O cache 34 is full, meaning that a cache line of data stored in every possible memory location in the I/O cache 34, and the pseudo-LRU algorithm identifies a locked memory location for eviction, the cache control logic 32 will not evict the cache line of data in the locked memory location. Rather, the cache control means will toggle the value of the bit associated with the first level node to identify the memory location of the pair of memory locations associated with the first level node. For example, referring to FIG. 3B, if the cache control logic 32 has locked the cache line of data in the memory location designated by tag T4, this cache line of data will not be evicted until the memory location is "unlocked" by the cache control logic 32. In the event that the I/O cache 34 is full, and the last used cache line was the cache line of data in the memory location tag T8, then the pseudo-LRU algorithm will identify the cache line of data in memory location tag T4 for eviction. However, because memory location tag T4 is a locked memory location, the cache control logic 32 will toggle the bit associated with first level node B21 from 1 to 0 thereby evicting the cache line in memory location tag T0 instead of the cache line in locked memory location tag T4.

In some instances, a memory location may be locked indefinitely. In order to ensure that data may still be transferred between a first data bus 16A and a second data bus 16B, the cache control logic 32 ensures that at all times at least one cache line will be available for memory transfers. The cache control logic 32 does this simply by ensuring that not all of the memory locations are locked.

The bus control unit 30 further comprises window registers 39 which can be set with addresses by the CPU module. The window registers 39 comprise upper and lower boundary addresses of logical memory and can designate, in association with the cache control logic 32, that the addresses between the two addresses stored in the window registers 39 are "windows" or "holes" which are directed to another bus control unit (not shown). In this way, the bus control unit 30 can support several bus control units connected to the MPI bus and bridging the MPI bus to other peripheral devices not connected to the second address bus 14B and the second data bus 16B. In this way, multiple bridge support is permitted between the MPI bus and other buses, whether they are PCI type buses or other types of buses. Accordingly, this permits the first address bus 14A and the first data bus 16A, corresponding to the MPI-bus, to be connected to a third address bus and a third data bus through another bus control unit 30. It is also apparent that the second address bus 14B and the second data bus 16B may transfer data to the third data bus and the third address bus through the MPI-bus.

In addition, the window registers 39 comprise a "postable" bit which when set high indicates that the data written to the addresses designated by the window register are "posted" or "buffered". This means that the hardware receiving the data, namely the other bus control unit, "posts" or "buffers" the write operation and completes the write operation as soon as the speed of the MPI bus permits it. In this way, the potential for communication between two separate bus control units 30 is improved, but there may be a problem if the software is unaware of the postable feature.

In general, the window registers 39 can define address locations with up to 64 KB resolution. In other words, the upper 16 bits of each of the window registers 39 may be written to and the lower 16 bits are reserved. In a preferred embodiment the least significant bit of the address defining the lower region of the hole is the postable bit and a high value written to this bit will indicate that the writes are posted or buffered. To disable this "window" or "hole", the address for the upper memory location and the lower memory location are set to be equal.

The PCI control logic 37 and PCI configuration logic 38 also perform PCI diagnostics to ensure there are no errors in the system 10. In order to make sure the PCI bus and the bridge function of the bus control unit 30 are operating correctly, the PCI control logic 37 comprises circuitry to detect the following errors:

(a) Parity error generation on the address bus or data bus;
(b) Target abort cycles generated by the bridge on the PCI bus; and
(c) Retry configuration cycles on the PCI bus continuously until the PCI bus time out mechanism can be tested.

In addition, the bus control unit 30 can test the error detection circuitry of the bus control unit 30. This is done by the cache control logic 32 by systematically injecting errors into the system 10 and then ensuring that these errors are detected. This permits the system 10 to be more easily tested and verified.

In the event of a fault being detected by the PCI diagnostics, the bus control unit 30 comprises a programmable mechanism to signal different type of faults to different interrupts in the system. Such errors include a parity error on the MPI or PCI bus, a PCI target abort which essentially means a fault in the PCI bus, an MPI bus time out, PCI bus time out, and other errors.

Each error detection mechanism has a two bit programmable register associated with it. These two bits encode one of four destination pins that the system 10 uses to indicate different categories of fault. The system can use this mechanism to treat errors of different severity with different actions or priorities. In a preferred embodiment, if two sources have identical bits encoded, the result is ANDED and software must read the error registers directly to discover the exact source.

It will be understood that, although various features of the invention have been described with respect to one or another of the embodiments of the invention, the various features and embodiments of the invention may be combined or used in conjunction with other features and embodiments of the invention as described and illustrated herein.

Although this disclosure has described and illustrated certain preferred embodiments of the invention, it is to be understood that the invention is not restricted to these particular embodiments. Rather, the invention includes all embodiments which are functional, electrical or mechanical equivalents of the specific embodiments and features that have been described and illustrated herein.

The embodiments of the invention in which an exclusive property or privilege is claimed are defined as follows:

1. In a computer system having a first address bus and a first data bus, a cache device comprising:

cache memory means comprising a maximum number of memory locations, each memory location operable to store one cache line of data;

cache control means for controlling the storage of cache lines of data to the cache memory means from the first data bus and retrieval of cache lines of data from the cache memory means, said cache control means comprising a register means for storing binary values;

wherein the maximum number of memory locations is equal to $2^N$ where N is an integer greater than zero;

wherein the cache control means associates each memory location with a unique locating path, said locating path defined by one and only one node on each of N levels of nodes;

wherein for a first level of nodes, the cache control means associates each pair of memory locations with a first level node, said first level nodes being associated with a binary value which identifies each memory location of the pair of memory locations associated with each of the first level nodes, each first level node being associated with one of the bits in the register means for storing the binary value of the first level node;

wherein for each level of nodes to a (N-1)th level, the cache control means associates each pair of nodes on a level of nodes with a higher level node, each of said higher level nodes being associated with a binary value which identifies each node of the pair of nodes associated with each of the higher level nodes, each higher level node being associated with one of the bits in the register means for storing the binary value of the higher level node;

wherein after the cache control means retrieves a cache line of data from one of the memory locations, the cache control means sets the bits in the register means to identify the unique locating path of the memory location from which the cache line of data was retrieved; and wherein when all of the memory locations have cache lines stored therein, the cache control means evicts a cache line of data stored in the memory location identified by a unique locating path passing through one node on each of the N levels of nodes such that the binary value associated with each node is opposite to the value of the bit in the register means corresponding to the one node on each of the N levels of nodes.

2. A cache device as defined in claim 1 wherein the cache control means evicts the cache line of data immediately after all the memory locations have Modified cache lines stored therein.

3. A cache device as defined in claim 1 wherein the integer N is programmable.

4. A cache device as defined in claim 3 wherein the cache memory means can store a maximum number of bytes of data which is independent of the integer N; and wherein as the integer N decreases, there is a proportional increase in the data contained in each cache line of data.

5. A cache device as defined in claim 4 wherein the cache control means is programmable to lock a memory location so that the cache line in the locked memory location cannot be evicted; and wherein when the memory location identified by the unique locating path having nodes with an opposite value to the value of the bits in the register means is the locked memory location, the cache control means toggles the value of the bit associated with the first level node to identify another memory location of the pair of memory locations associated with the first level node.

6. A cache device as defined in claim 5 wherein the device forms part of bridge means for bridging the first address bus and the first data bus with a second address bus and a second data bus;

wherein the cache control means controls the storage of cache lines of data to the memory locations of the cache memory means from the first data bus and the second data bus and the cache control means controls the retrieval of cache lines of data from the memory location of the cache memory means to the first data bus and the second data bus; and wherein all data passing from the first data bus to the second data bus is first stored in the cache memory means.

7. A cache device as defined in claim 6 further comprising arbitration controller means for arbitrating simultaneous storage of cache lines of data to one of the memory locations from the first data bus and the second data bus and for arbitrating simultaneous retrieval of cache lines of data from each memory location to the first data bus and the second data bus.

8. A cache device as defined in claim 6 further comprising multiple bridge support means for supporting another bridge means separately connected to the first data bus and the first address bus, said another bridge means bridging the first address bus and first data bus with a third data bus and a third address bus; and wherein said multiple bridge support means comprises a window register means for storing a first address and a second address; and wherein an address between the first address and the second address are accessible through the another bridge means on the third address bus and third data bus.

9. A cache device as defined in claim 8 wherein the window register means comprises a postable bit operable to have a first value and a second value such that if the another bridge means has a buffer means for temporarily storing data destined for the third data bus and third address bus, the postable bit is set to the first value, and, if the another bridge means does not have a buffer means for temporarily storing data destined for the third data bus and third address bus, the postable bit is set to the second value.

10. A cache device as defined in claim 1 wherein the device forms part of bridge means for bridging the first address bus and the first data bus with a second address bus and a second data bus;

wherein the cache control means controls the storage of cache lines of data to the memory locations of the cache memory means from the first data bus and the second data bus and the cache control means controls the retrieval of cache lines of data from the memory locations of the cache memory means to the first data bus and the second data bus; and wherein all data passing from the first data bus to the second data bus is first stored in one of the memory locations of the cache memory means.

11. A cache device as defined in claim 10 wherein the cache control means is programmable to lock a memory location so that the cache line in the locked memory location is not evictable; and wherein when the memory location identified by the unique locating path having nodes with an opposite value to the value of the bits in the register means is the locked memory location, the cache control means toggles the value of the bit associated with the first level node to identify another memory location of the pair of memory locations associated with the first level node.

12. In a computer system having a cache means comprising a maximum number of memory locations for storing cache lines of data, said maximum number being equal to $2^N$ where N is an integer greater than zero, a method of selecting a cache line of data to be evicted from the cache means when all of the memory locations have a cache line stored therein, said method comprising the steps of:

associating each memory location with a unique locating path, said locating path defined by one and only one node on each of N levels of nodes;

associating each pair of memory locations with a first level node, said first level nodes being associated with a binary value which identifies each memory location of the pair of memory locations associated with each of the first level nodes;

associating each pair of nodes on each level of nodes to an (N-1)th level with a higher level node, each of said higher level nodes being associated with a binary value which identifies each node of the pair of nodes associated with the higher level nodes;

whenever a cache line of data is retrieved from a target memory location, setting said binary values of the nodes through which the unique locating path to the target memory location passes to values which do not identify the unique locating path of the target memory location; and evicting the cache line of data stored in the memory location having by a unique locating path identified by the binary values of the nodes.

13. A method as defined in claim 12 wherein the integer N is programmable;

the cache memory means can store a maximum number of bytes of data which is independent of the integer N; and wherein as the integer N decreases, there is a proportional increase in the data contained in each cache line of data.

14. In a computer system having a first address bus and a first data bus, a cache device comprising:

cache memory means comprising a maximum number of memory locations, each memory location operable to store one cache line of data;

cache control means for controlling the storage of cache lines of data to the cache memory means from the first data bus and retrieval of cache lines of data from the cache memory means, said cache control means comprising a register means for storing binary values;

wherein the maximum number of memory locations is equal to $2^N$ where N is an integer greater than zero;

wherein the cache control means associates each memory location with a unique locating path, said unique locating path defined by one and only one node on each of N levels of nodes;

wherein for a first level of nodes, the cache control means associates each pair of memory locations with a first level node, said first level nodes being associated with a binary value which identifies each memory location of the pair of memory locations associated with each of the first level nodes, each first level node being associated with one of the bits in the register means for storing the binary value of the first level node;

wherein for each level of nodes to a (N-1)th level, the cache control means associates each pair of nodes on a level of nodes with a higher level node, each of said higher level nodes being associated with a binary value which identifies each node of the pair of nodes associated with each of the higher level nodes, each higher level node being associated with one of the bits in the register means for storing the binary value of the higher level node;

wherein after the cache control means stores or retrieves a cache line of data from one of the memory locations, the cache control means sets the bits associated with the nodes through which the unique locating path of the one of the memory locations passes to values which do not identify the unique locating path of the one of the memory locations; and wherein when all of the memory locations have cache lines stored therein, the cache control means evicts a cache line of data stored in the memory location having a unique locating path identified by the binary values of the nodes.

15. A cache device as defined in claim 14 wherein the integer N is programmable;

the cache means can store a maximum number of bytes of data which is independent of the integer N; and wherein as the integer N decreases, there is a proportional increase in the data contained in each cache line of data.

16. A cache device as defined in claim 15 wherein the cache control means is programmable to lock a memory location so that the cache line in the locked memory location is not evictable; and wherein when the memory location having a unique locating path identified by the binary values of the nodes is the locked memory location, the cache control means toggles the value of the bit associated with the first level node to identify another memory location of the pair of memory locations associated with the first level node.

17. A cache device as defined in claim 16 wherein the device forms part of bridge means for bridging the first address bus and the first data bus with a second address bus and a second data bus;

wherein the cache control means controls the storage of cache lines of data to the memory locations of the cache memory means from the first data bus and the second data bus and the cache control means controls the retrieval of cache lines of data from the memory locations of the cache memory means to the first data bus and the second data bus;

wherein all data passing from the first data bus to the second data bus is first stored in one of the memory locations of the cache memory means;

wherein the second data bus is slower than the first data bus; and wherein the cache control means sets the bits upon storage of data to the memory locations of the cache memory means from the second data bus and upon retrieval of data from the memory locations of the cache memory means to the second data bus.

18. A cache device as defined in claim 14 wherein the device forms part of bridge means for bridging the first address bus and the first data bus with a second address bus and a second data bus;

wherein the cache control means controls the storage of cache lines of data to the memory locations of the cache memory means from the first data bus and the second data bus and the cache control means controls the retrieval of cache lines of data from the memory locations of the cache memory means to the first data bus and the second data bus; and wherein all data passing from the first data bus to the second data bus is first stored in one of the memory locations of the cache memory means.

19. A cache device as defined in claim 14 wherein the cache control means evicts the cache line of data immediately after all the memory locations have Modified cache lines stored therein.

* * * * *